(12) United States Patent
Kawahara

(10) Patent No.: US 9,698,971 B2
(45) Date of Patent: Jul. 4, 2017

(54) DIGITAL FILTER CIRCUIT, RECEPTION CIRCUIT, AND SEMICONDUCTOR INTEGRATED CIRCUIT

(71) Applicant: SOCIONEXT INC., Yokohama-shi, Kanagawa (JP)

(72) Inventor: Satoshi Kawahara, Shinagawa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/140,216

(22) Filed: Apr. 27, 2016

(65) Prior Publication Data

US 2016/0337118 A1    Nov. 17, 2016

(30) Foreign Application Priority Data

May 12, 2015    (JP) .................................. 2015-097342

(51) Int. Cl.
| | |
|---|---|
| *H04L 27/08* | (2006.01) |
| *H04L 7/033* | (2006.01) |
| *H03K 5/135* | (2006.01) |
| *H03L 7/08* | (2006.01) |
| *H03M 9/00* | (2006.01) |
| *H04B 1/16* | (2006.01) |
| *H03K 5/00* | (2006.01) |

(52) U.S. Cl.
CPC ........... *H04L 7/0331* (2013.01); *H03K 5/135* (2013.01); *H03L 7/0807* (2013.01); *H03M 9/00* (2013.01); *H04B 1/16* (2013.01); *H03K 2005/00052* (2013.01)

(58) Field of Classification Search
CPC ................................. H03G 3/3052; H03L 7/08
USPC ......... 375/345, 316, 341; 704/214; 327/157; 455/127.2, 136, 232.1
See application file for complete search history.

(56) References Cited

U.S. PATENT DOCUMENTS

| | | | | |
|---|---|---|---|---|
| 2011/0305269 | A1* | 12/2011 | Huang | ............... H04L 25/03076 375/229 |
| 2012/0281771 | A1* | 11/2012 | Oga | ........................ H04L 27/20 375/241 |

FOREIGN PATENT DOCUMENTS

| | | |
|---|---|---|
| JP | 62-253224 A | 11/1987 |
| JP | 01-270428 A | 10/1989 |
| JP | 2010-041639 A | 2/2010 |

* cited by examiner

*Primary Examiner* — Khai Tran
(74) *Attorney, Agent, or Firm* — Arent Fox LLP

(57) ABSTRACT

A phase to digital converter determines whether a phase of an internal clock advances or delays with respect to an input serial signal and outputs a first determination code, a determination circuit outputs, for each of first periods, a second determination code based on a plurality of the first determination codes, a gain control code generator circuit generates a gain control code based on a total sum of the first determination codes during the first period, and a phase adjustment code generator circuit gives a gain in accordance with the gain control code to the second determination code, and generates and outputs a phase adjustment code so that the phase of the internal clock is adjusted to make the phase of the internal clock follow the input serial signal.

20 Claims, 5 Drawing Sheets

| D(n) | B(n) | D(n+1) | Judge |
|---|---|---|---|
| 0 | 0 | 0 | 0 |
| 0 | 0 | 1 | +1 |
| 0 | 1 | 0 | NOP |
| 0 | 1 | 1 | −1 |
| 1 | 0 | 0 | −1 |
| 1 | 0 | 1 | NOP |
| 1 | 1 | 0 | +1 |
| 1 | 1 | 1 | 0 |

| N | D0 | B0 | D1 | Judge |
|---|---|---|---|---|
| 1 | 0 | 0 | 1 | +1 |
| 2 | 1 | 1 | 0 | +1 |
| 3 | 0 | 1 | 1 | −1 |
| 4 | 1 | 1 | 1 | 0 |
| 5 | 1 | 1 | 0 | +1 |
| 6 | 0 | 0 | 1 | +1 |
| 7 | 1 | 1 | 0 | +1 |
| 8 | 0 | 0 | 0 | 0 |
| | | | Total | +2 |

| Total | Conventional | Proposal |
|---|---|---|
| +8 | +1 | +8 |
| +7 | +1 | +7 |
| ... | ... | ... |
| +1 | +1 | +1 |
| 0 | 0 | 0 |
| −1 | −1 | −1 |
| ... | ... | ... |
| −7 | −1 | −7 |
| −8 | −1 | −8 |

DIGITAL FILTER CIRCUIT, RECEPTION CIRCUIT, AND SEMICONDUCTOR INTEGRATED CIRCUIT

CROSS-REFERENCE TO RELATED APPLICATION

This application is based upon and claims the benefit of priority of the prior Japanese Patent Application No. 2015-097342, filed on May 12, 2015, the entire contents of which are incorporated herein by reference.

FIELD

The embodiments discussed herein are directed to a digital filter circuit, a reception circuit, and a semiconductor integrated circuit.

BACKGROUND

In accordance with speed-up, increase in capacity, and reduction in size of a computer or an electronic device, an operating speed of a serializer/de-serializer (SerDes) by which semiconductor integrated circuits (LSIs) and the like are communicated with a serial signal, is increasing. As illustrated in an example in FIG. 8, a semiconductor integrated circuit (LSI) 110 on a transmitting side (Tx) performs, by a serializer 112, parallel-to-serial conversion on parallel data output from an internal circuit 111 to convert the parallel data to serial data, and transmits the serial data. The serializer 112 converts, with the use of a multiplexer 113, the parallel data into the serial data by using a clock output from a phase locked loop (PLL) circuit 114, and transmits the serial data via an equalizer 115.

A semiconductor integrated circuit (LSI) 120 on a receiving side (Rx) performs, by a de-serializer 122, serial-to-parallel conversion on the serial data received via a transmission path (communication channel) 130 to return the serial data to the parallel data, and supplies the parallel data to an internal circuit 121. The de-serializer 122 converts, with the use of a demultiplexer 124, the serial data received via an equalizer 123 into the parallel data by using a clock output from a PLL circuit 126 and having a phase and the like adjusted by a clock data recovery (CDR) circuit 125, and outputs the parallel data.

In communication using a serial signal, a CDR system in which a clock is embedded, on a transmitting side, in a data signal to be transmitted, and the embedded clock is reproduced, on a receiving side, from the received data signal, is a useful technique. A CDR circuit which reproduces a clock and data from a received data signal, is a negative-feedback circuit which controls to make a phase of a clock follow the received data. In order to realize an appropriate operation in the receiving-side circuit, there is a need to control appropriately a negative-feedback loop gain in the CDR circuit. As one of requests for a serializer/de-serializer, the serializer/de-serializer is requested to quickly lock a CDR circuit (to quickly put the CDR circuit in a stable).

There is proposed a PLL circuit in which determination is made whether or not the PLL circuit is locked in operation, and a gain of the PLL circuit is automatically controlled based on a result of the determination (refer to Patent Document 1, for example). The proposed PLL circuit performs the automatic control in a manner that the gain is reduced when the PLL circuit is locked, and the gain is increased when the PLL circuit is not locked, based on the result of the determination, to thereby realize reduction in capture time and improvement of error rate.

[Patent Document 1] Japanese Laid-open Patent Publication No. 2010-41639

In a CDR circuit, in a case where a negative-feedback loop gain is too small, it takes a long time until when the circuit is locked. On the other hand, in a case where the negative-feedback loop gain is too large, a frequency of occurrence of error when the circuit is locked is increased, resulting in that reliability of data is decreased. A loop gain in a conventional CDR circuit is set to a fixed value previously obtained through calculation, in order to realize an appropriate loop characteristics. If the fixed value is too large, oscillation occurs or an error frequency increases when the circuit is locked, and thus the fixed value is restricted by the loop gain in the locked state, so that it is difficult to increase the loop gain to reduce a time until when the circuit is locked in the CDR circuit of a reception circuit.

SUMMARY

An aspect of a digital filter circuit includes: a first determinator circuit configured to determine whether a phase of a clock used for logic determination of an input serial signal, advances or delays with respect to the input serial signal, and to output a first determination code; a second determinator circuit configured to output, for each of first periods, a second determination code indicating that the phase of the clock is made to be advanced or delayed based on a plurality of the first determination codes; a first code generator circuit configured to generate a gain control code based on a total sum of the first determination codes during the first period; and a second code generator circuit configured to switch a gain to be given to the second determination code in accordance with the gain control code, and to generate and output, based on the second determination code, a phase adjustment code so that the phase of the clock is adjusted to make the phase of the clock follow the input serial signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described based on the drawings.

Figure 1:
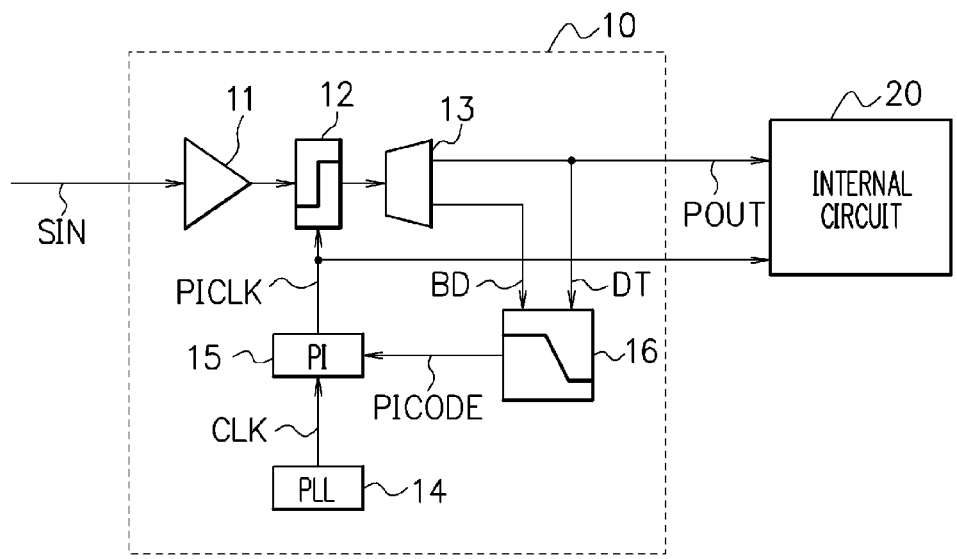
FIG. 1 is a diagram illustrating a configuration example of a semiconductor integrated circuit in a present embodiment.
Figure 8:
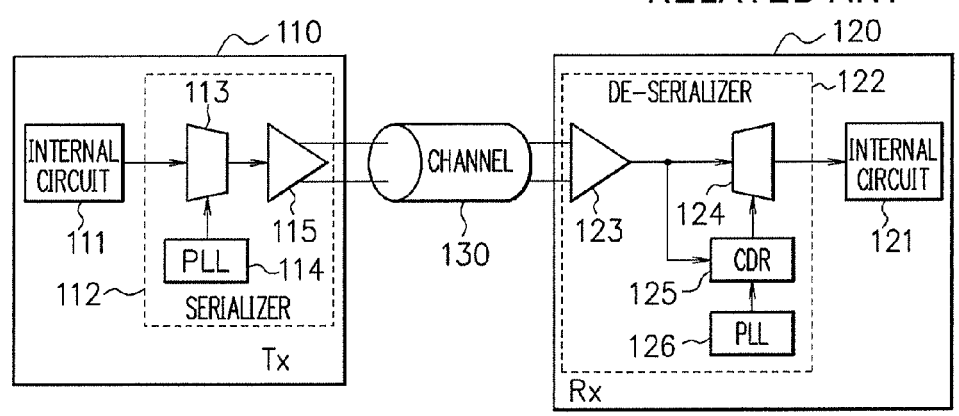
FIG. 8 is a diagram illustrating an example of communication between semiconductor integrated circuits.

FIG. 1 is a block diagram illustrating a configuration example of a semiconductor integrated circuit in a present embodiment. The semiconductor integrated circuit in the present embodiment reproduces a clock and data from a serial data signal received via a transmission path or the like, in a similar manner to the semiconductor integrated circuit (LSI) on the receiving side (Rx) illustrated in FIG. 8, for example. The semiconductor integrated circuit in the present embodiment includes a reception circuit 10 and an internal circuit 20 such as a logic circuit. The reception circuit 10 performs an operation of a de-serializer which converts serial data into parallel data. The internal circuit 20 receives data from the reception circuit 10 and performs a processing operation.

FIG. 1 illustrates the reception circuit 10 to which a clock data recovery (CDR) circuit of phase interpolation type is applied, as one example. The reception circuit 10 includes an equalizer 11, a latch circuit 12, a demultiplexer 13, a phase locked loop (PLL) circuit 14, a phase interpolator (PI) circuit 15, and a digital filter circuit 16.

The equalizer 11 performs equalization processing on a serial input signal SIN received via a not-illustrated transmission path, and corrects waveform distortion and the like of the signal caused by the transmission path. The latch circuit 12 latches the input signal after being subjected to the equalization processing by the equalizer 11, by using a phase-adjusted internal clock PICLK.

The phase of the internal clock PICLK is adjusted so that data detection and boundary detection with respect to the serial input signal are realized by the latch circuit 12. The phase of the internal clock PICLK is adjusted so that logic determination (latch) of the signal by the latch circuit 12 is conducted in the vicinity of a transition timing of the serial input signal (corresponding to a boundary) and in the vicinity of a middle of the transition timing and the next transition timing of the serial input signal (corresponding to data). The latch circuit 12 operates as a logic determination circuit which performs the logic determination of the serial input signal SIN by using the phase-adjusted internal clock PICLK.

The demultiplexer 13 demultiplexes the output of the latch circuit 12, and outputs paralleled data DT and boundaries BD. The data DT output from the demultiplexer 13 is also output to the internal circuit 20 as parallel output data POUT obtained by performing serial-to-parallel conversion on the serial input data obtained from the received serial input signal. To the internal circuit 20, the phase-adjusted internal clock PICLK is also supplied. The PLL circuit 14 generates a reference clock CLK, and supplies the reference clock CLK to the phase interpolator circuit 15.

The phase interpolator circuit 15 performs, on the reference clock CLK supplied from the PLL circuit 14, control of a phase in accordance with a phase adjustment code PICODE output from the digital filter circuit 16, and outputs the resultant as the internal clock PICLK. For example, the phase interpolator circuit 15 shifts the phase of the reference clock CLK by a phase shift amount indicated by the phase adjustment code PICODE, and outputs the phase-shifted reference clock CLK as the internal clock PICLK.

The digital filter circuit 16 determines whether the phase of the internal clock PICLK advances or delays with respect to the serial input signal SIN, based on the data DT and the boundaries BD output from the demultiplexer 13. Based on a result of the determination, the digital filter circuit 16 generates and outputs the phase adjustment code PICODE for advancing or delaying the phase of the internal clock PICLK.

The reception circuit 10 illustrated in FIG. 1 determines, by the digital filter circuit 16, whether the phase of the internal clock PICLK advances or delays with respect to the serial input signal SIN, based on the data DT and the boundaries BD in the serial input signal SIN latched by the latch circuit 12 and output via the demultiplexer 13. The reception circuit 10 controls, by the phase interpolator circuit 15, the phase in accordance with the result of the determination, and then the internal clock PICLK whose phase is adjusted to be an appropriate phase with respect to the serial input signal SIN, is output. That is, the reception circuit 10 performs negative feedback control to make the phase of the internal clock PICLK follow the received data, and adjusts the phase of the internal clock PICLK to be the appropriate phase with respect to the serial input signal SIN.

The reception circuit 10 latches, by the latch circuit 12, the data DT in the serial input signal SIN by using the phase-adjusted internal clock PICLK. And the reception circuit 10 demultiplexes the latched data DT by the demultiplexer 13 to turn the data DT to parallel data, and outputs the parallel data as parallel output data POUT. In the manner as described above, the reception circuit 10 reproduces the clock and the data from the received serial input signal SIN. The parallel output data POUT output from the reception circuit 10 is taken into the internal circuit 20 by a not-illustrated flip-flop which operates based on the internal clock PICLK, for example, and the data is subjected to processing and the like.

Figure 2:
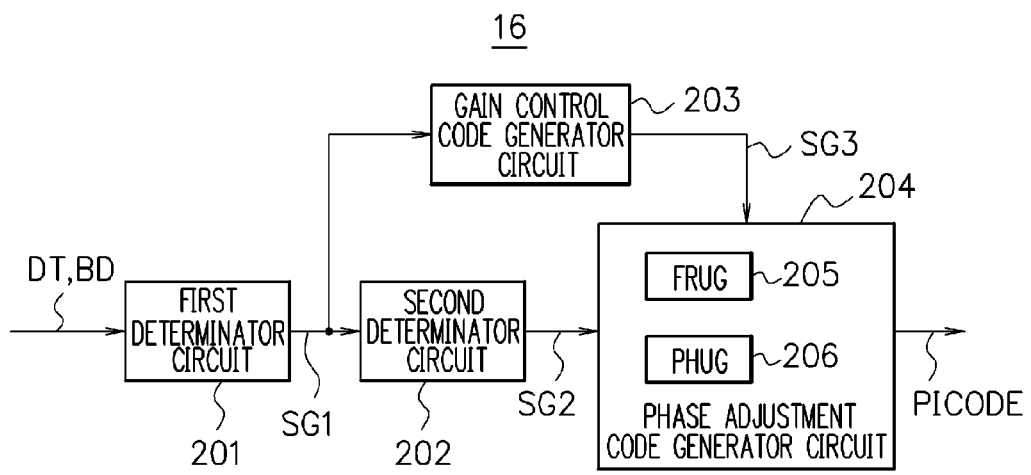
FIG. 2 is a diagram illustrating a functional configuration example of a digital filter circuit in the present embodiment.

FIG. 2 is a block diagram illustrating a functional configuration example of the digital filter circuit 16 in the present embodiment. The digital filter circuit 16 includes a first determinator circuit 201, a second determinator circuit 202, a gain control code generator circuit 203, and a phase adjustment code generator circuit 204. The first determinator circuit 201 determines, from a set of data DT and boundary (transition point of data) BD output from the demultiplexer 13, whether the phase of the internal clock PICLK advances or delays with respect to the serial input signal SIN, and outputs a first determination code SG1 indicating a result of the determination.

To the second determinator circuit 202, the first determination codes SG1 output from the first determinator circuit 201 are input. Based on the input first determination codes SG1, the second determinator circuit 202 outputs the determination code SG1 which holds a majority (whose frequency of appearance is the highest) during a certain period (in a certain number of determination), as a second determination code SG2. The second determination code SG2 is information indicating that the phase of the internal clock PICLK advances or delays with respect to the serial input signal SIN in the entirety of the certain period (the certain number of determination).

The gain control code generator circuit 203 generates, based on the first determination codes SG1 output from the first determinator circuit 201, a gain control code SG3 which controls a loop gain in the negative feedback control of the reception circuit 10. The gain control code generator circuit 203 performs control to switch the loop gain in the negative feedback control based on the first determination codes SG1.

The control to switch the loop gain is performed in accordance with a difference between a frequency at which it is determined that the phase of the internal clock PICLK advances with respect to the serial input signal SIN and a frequency at which it is determined that the phase of the internal clock PICLK delays with respect to the serial input signal SIN during the certain period (in the certain number of determination).

When the difference between the frequencies is small, the gain control code generator circuit 203 controls the gain control code SG3 to reduce the loop gain in the negative feedback control. The gain control code generator circuit 203 controls the gain control code SG3 so that the loop gain in the negative feedback control increases as the difference between the frequencies becomes large.

The phase adjustment code generator circuit 204 generates and outputs the phase adjustment code PICODE for adjusting the phase of the internal clock PICLK, in accordance with the second determination code SG2 output from the second determinator circuit 202 and the gain control code SG3 output from the gain control code generator circuit 203. The phase adjustment code generator circuit 204 includes a frequency update generator circuit (FRUG) 205 and a phase update generator circuit (PHUG) 206. The frequency update generator circuit 205 is for tracking a frequency deviation of the internal clock PICLK with respect to the serial input signal SIN, and adjusting the difference of the frequency between the internal clock PICLK and the serial input signal SIN. The phase update generator circuit 206 is for tracking a phase deviation of the internal clock PICLK with respect to the serial input signal SIN, and adjusting the difference of the phase between the internal clock PICLK and the serial input signal SIN.

Figure 3:
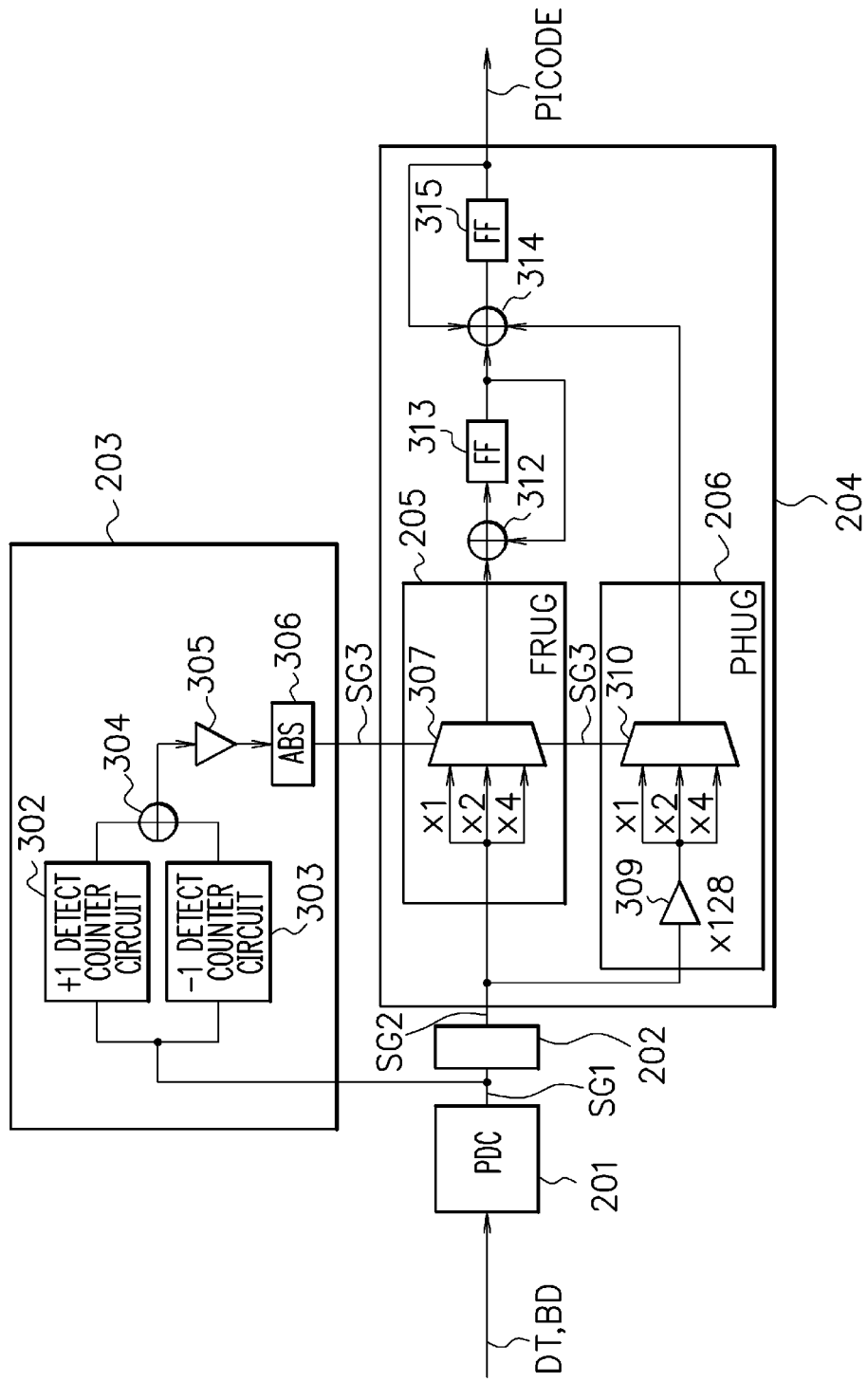
FIG. 3 is a diagram illustrating a configuration example of the digital filter circuit in the present embodiment.

FIG. 3 is a block diagram illustrating a configuration example of the digital filter circuit 16 in the present embodiment. A phase to digital converter (PDC) 201 as the first determinator circuit determines, based on a set of data DT and boundary (transition point of data) BD to be input, whether the phase of the internal clock PICLK advances or delays with respect to the serial input signal SIN. Pieces of data D0, D1, D2, and D3, and boundaries B0, B1, B2, and B3 in the serial input signal are represented as in FIG. 4A, for example. Therefore, it is possible to determine whether the phase of the internal clock PICLK advances or delays, based on a relationship between the boundary BD and the pieces of data DT in front of and behind the boundary BD sampled from the received serial signal.

In the present embodiment, the phase to digital converter 201 outputs a value "−1" as the first determination code SG1, when it is determined that the phase of the internal clock PICLK advances with respect to the serial input signal SIN. The phase to digital converter 201 outputs a value "+1" as the first determination code SG1, when it is determined that the phase of the internal clock PICLK delays with respect to the serial input signal SIN. The phase to digital converter 201 outputs a value "0" as the first determination code SG1, when it is not possible to determine the relationship of the phase of the internal clock PICLK with respect to the serial input signal SIN.

Figures 4A, 4B, 5A, 5B:
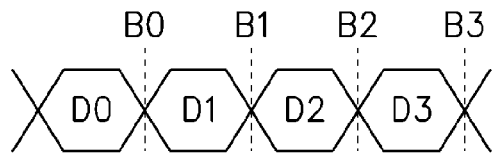
FIG. 4A is a diagram illustrating an example of data and boundaries in a serial input signal.
FIG. 4B is a diagram for explaining an operation of a phase to digital converter in the present embodiment.
FIG. 5A and FIG. 5B are diagrams for explaining a gain control code generator circuit in the present embodiment.

As illustrated in FIG. 4B, when [previous data D(n), boundary B(n), subsequent data D(n+1)] is [0, 0, 1] or [1, 1, 0], the phase to digital converter 201 determines that the phase of the internal clock PICLK is delayed, and outputs a value "+1" as the first determination code SG1. When [previous data D(n), boundary B(n), subsequent data D(n+1)] is [0, 1, 1] or [1, 0, 0], the phase to digital converter 201 determines that the phase of the internal clock PICLK is advanced, and outputs a value "−1" as the first determination code SG1. In a case other than the above, the phase to digital converter 201 outputs a value "0" as the first determination code SG1.

The determination circuit 202 as the second determinator circuit outputs, based on the first determination codes SG1 input thereto, the determination code SG1 which holds a majority (whose frequency of appearance is the highest) during the certain period (in the certain number of determination), as the second determination code SG2. In the present embodiment, the determination circuit 202 calculates a total sum of the values of the first determination codes SG1 input during the certain period (in the certain number of determination). When the value of the total sum is a positive value, the determination circuit 202 outputs a value "+1" as the second determination code SG2. When the value of the total sum is a negative value, the determination circuit 202 outputs a value "−1" as the second determination code SG2. When the value of the total sum is 0, the determination circuit 202 outputs a value "0" as the second determination code SG2. In other words, the determination circuit 202 outputs information regarding a sign of the total sum of the values of the first determination codes SG1 input during the certain period (in the certain number of determination), as the second determination code SG2. Note that the determination circuit 202 is only needed to be able to select and output the first determination code SG1 which holds a majority (whose frequency of appearance is the highest), so that the determination circuit 202 is not limited to the above-described example, and it may also be a majority logic circuit, for example.

The gain control code generator circuit 203 generates the gain control code SG3 which controls the loop gain, based on the total sum of the first determination codes SG1 output from the phase to digital converter 201 during the certain period (in the certain number of determination). The gain control code generator circuit 203 includes counter circuits 302 and 303, an adder 304, a buffer 305, and a calculation circuit 306.

The counter circuits 302 and 303 are counter circuits which count a number of times of output of the value "+1" and "−1", respectively, as the first determination code SG1 from the phase to digital converter 201 during the certain period (in the certain number of determination). When the counter circuit 302 detects that the value "+1" is output as the first determination code SG1 from the phase to digital converter 201, it increments a count value by one. When the counter circuit 303 detects that the value "−1" is output as the first determination code SG1 from the phase to digital converter 201, it decrements a count value by one. An initial value of the count value of each of the counter circuits 302 and 303 is 0, and each of the count values is reset to the initial value every time the certain period elapses (every certain number of determination).

Every time the certain period elapses (every certain number of determination), the adder 304 adds the count values of the counter circuits 302 and 303, and outputs a result of the addition. Therefore, an output value of the adder 304 corresponds to information indicating a degree of bias of the first determination codes SG1 output from the phase to digital converter 201, by using a numeric value. The buffer 305 used for scaling the output value of the adder 304 in accordance with a configuration of the phase adjustment code generator circuit 204, multiplies the output value of the adder 304 by a constant, and outputs the resultant. The calculation circuit 306 obtains an absolute value of the scaled output value of the adder 304, and outputs the obtained absolute value as the gain control code SG3.

The phase adjustment code generator circuit 204 includes a frequency update generator circuit (FRUG) 205, a phase update generator circuit (PHUG) 206, adders 312 and 314, and flip-flops 313 and 315. Each of the frequency update generator circuit 205 and the phase update generator circuit 206 gives, to the second determination code SG2 output from the determination circuit 202, a gain in accordance with the gain control code SG3 output from the gain control code generator circuit 203, and outputs the resultant. In the present example, it is set that the frequency update generator circuit 205 gives one-fold gain, two-fold gain, or four-fold gain to the second determination code SG2 in accordance with the gain control code SG3, and the phase update generator circuit 206 gives 128-fold gain, 256-fold gain, or 512-fold gain to the second determination code SG2 in accordance with the gain control code SG3.

The frequency update generator circuit 205 includes a selector 307. The selector 307 selects and outputs, in accordance with the gain control code SG3 output from the gain control code generator circuit 203, any one of values obtained by multiplying the second determination code SG2 by one, by two, and by four, respectively. The phase update generator circuit 206 includes a buffer 309 and a selector 310. The selector 310 selects and outputs, in accordance with the gain control code SG3 output from the gain control code generator circuit 203, any one of values obtained by multiplying the second determination code SG2 after being multiplied by 128 by the buffer 309, by one, by two, and by four, respectively.

The adder 312 adds an output of the frequency update generator circuit 205 and an output of the flip-flop 313, and supplies an output thereof to the flip-flop 313. The adder 314 adds an output of the phase update generator circuit 206, the output of the flip-flop 313, and an output of the flip-flop 315, and supplies an output thereof to the flip-flop 315. The output of the flip-flop 315 is supplied to the phase interpolator circuit 15 as the phase adjustment code PICODE.

An operation of the digital filter circuit 16 illustrated in FIG. 3 will be described. Note that hereinafter, description will be made by citing a case where the phase to digital converter 201 performs determination to output a first determination code SG1 for each cycle in a serial input signal, and the determination circuit 202 and the gain control code generator circuit 203 output a second determination code SG2 and the gain control code SG3 every time the determination in the phase to digital converter 201 is performed eight times, as an example. That is, description will be made by citing a case where the certain number of determination to be set to the certain period is eight times, as an example, but, this is only an example, and it is appropriately set the certain period (the certain number of determination) in accordance with a number of pieces of data to be paralleled in a reception circuit, and the like.

Based on a set of data DT and boundary BD to be input, the phase to digital converter 201 determines, for each cycle in the serial input signal, whether the phase of the internal clock PICLK advances or delays, and outputs a result of the determination as the first determination code SG1. The determination circuit 202 outputs, every time eight of the first determination codes SG1 are input, namely, every eight cycles in the serial input signal, the determination code SG1 which holds a majority (whose frequency of appearance is the highest), as the second determination code SG2. The gain control code generator circuit 203 generates and outputs, every time eight of the first determination codes SG1 are input, namely, every eight cycles in the serial input signal, the gain control code SG3 with magnitude in accordance with a total sum of the determination codes SG1.

For example, when data DT and boundaries BD are input as illustrated in FIG. 5A, the phase to digital converter 201 outputs "+1" as the first determination code SG1 in a first cycle, a second cycle, a fifth cycle, a sixth cycle, and a seventh cycle. The phase to digital converter 201 outputs "−1" as the first determination code SG1 in a third cycle, and outputs "0" as the first determination code SG1 in a fourth cycle and an eighth cycle.

Therefore, in the example illustrated in FIG. 5A, a total sum of the first determination codes SG1 during the period of eight cycles becomes "+4". In this case, the determination circuit 202 outputs "+1" as the second determination code SG2, since a value of the total sum of the first determination codes SG1 is a positive value. When a scaling coefficient is set to 0.5, the gain control code generator circuit 203 generates and outputs the gain control code SG3 which makes each of the selectors 307 and 310 in the frequency update generator circuit 205 and the phase update generator circuit 206 to select the second determination code SG2 to which two-fold gain is given.

In the phase adjustment code generator circuit 204, the adder 312 adds the second determination code SG2 to which two-fold gain is given by the frequency update generator circuit 205, and the output of the flip-flop 313, and supplies the resultant to the flip-flop 313. The adder 314 adds the second determination code SG2 to which 256-fold gain is given by the phase update generator circuit 206, the output of the flip-flop 313, and the output of the flip-flop 315, and supplies the resultant to the flip-flop 315. The output of the flip-flop 315 is supplied to the phase interpolator circuit 15 as the phase adjustment code PICODE.

In the present embodiment, in a case where the scaling coefficient in the gain control code generator circuit 203 is set to 0.5, for example, the gain control code generator circuit 203 generates and outputs the gain control code SG3 which makes each of the selectors 307 and 310 in the frequency update generator circuit 205 and the phase update generator circuit 206 to select the second determination code SG2 to which four-fold gain is given, when the value of the total sum of the first determination codes SG1 is "−8" to "−4", or "+4" to "+8". For example, the gain control code generator circuit 203 generates and outputs the gain control code SG3 which makes each of the selectors 307 and 310 in the frequency update generator circuit 205 and the phase update generator circuit 206 to select the second determination code SG2 to which two-fold gain is given, when the value of the total sum of the first determination codes SG1 is "−3" to "−2", or "+2" to "+3". For example, the gain control code generator circuit 203 generates and outputs the gain control code SG3 which makes each of the selectors 307 and 310 in the frequency update generator circuit 205 and the phase update generator circuit 206 to select the second determination code SG2 to which one-fold gain is given, when the value of the total sum of the first determination codes SG1 is "−1" to "+1".

As described above, the gain in each of the frequency update generator circuit 205 and the phase update generator circuit 206 in the phase adjustment code generator circuit 204 is dynamically changed in accordance with the value of the total sum of the first determination codes SG1. As illustrated in FIG. 5B, although the control of the loop gain has been conventionally conducted regardless of the value of the total sum of the first determination codes SG1, in the present embodiment, the total sum of the first determination codes SG1 is monitored one after another, and the loop gain is controlled in accordance with the value of the total sum of the first determination codes SG1, as represented as Proposal.

Therefore, it is possible that the loop gain in the negative feedback control of the CDR circuit in the reception circuit 10 is divided into a plurality of stages of three stages or more in accordance with the phase difference of the internal clock PICLK and the received data to be switched, and the loop gain in the negative feedback control is dynamically varied to be an appropriate value in accordance with the value of the total sum of the first determination codes SG1. Therefore, it is possible to reduce the time until when the circuit is locked in the CDR circuit, and realize the stability of data when the circuit is locked.

For example, when the value of the total sum of the first determination codes SG1 is large, namely, when the first determination codes SG1 are biased to either "+1" or "−1" (at a time of activation and the like, for example), a state where loop characteristics in the CDR circuit are greatly changed is created, and this state is different from a normal locked state, so that even if the loop gain becomes large, no influence is exerted on data communication. Since the loop gain is large, it is possible to realize quick transition from the activation-start state to the locked state. Further, when the normal locked state is created, the bias of the output of the first determination codes SG1 becomes small, and the total sum of the first determination codes SG1 converges to the vicinity of 0, so that control is performed to reduce the loop gain, and it is possible to realize the operation similar to the conventional operation.

Figure 6:
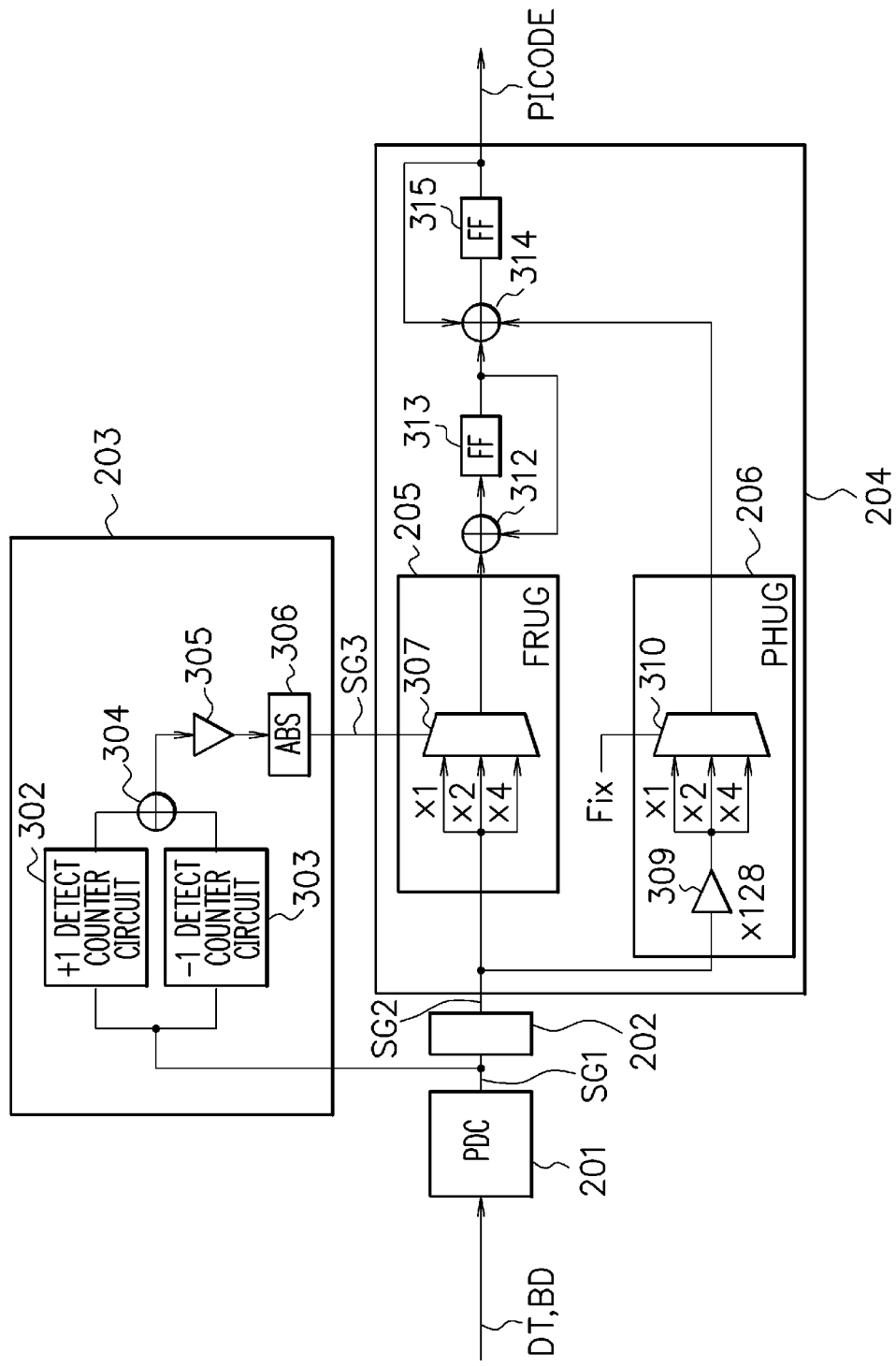
FIG. 6 is a diagram illustrating another configuration example of the digital filter circuit in the present embodiment.

Note that in the digital filter circuit 16 illustrated in FIG. 3, the gain is dynamically varied in accordance with the value of the total sum of the first determination codes SG1, in both of the frequency update generator circuit 205 and the phase update generator circuit 206 in the phase adjustment code generator circuit 204. When the gain in the frequency update generator circuit 205 is set to G1, and the gain in the phase update generator circuit 206 is set to G2, a degree of stability in the negative feedback control in the CDR circuit is in proportion to $G2/(\sqrt{G1})$, so that it is also possible that the gain is dynamically varied in accordance with the value of the total sum of the first determination codes SG1 only in either the frequency update generator circuit 205 or the phase update generator circuit 206. For example, it is also possible to design such that, as illustrated in FIG. 6, the gain is dynamically varied in accordance with the value of the total sum of the first determination codes SG1 in the frequency update generator circuit 205 in the phase adjustment code generator circuit 204, and the gain is set to a fixed value in the phase update generator circuit 206 in the phase adjustment code generator circuit 204. For example, it is also possible to design such that the gain is dynamically varied in accordance with the value of the total sum of the first determination codes SG1 in the phase update generator circuit 206 in the phase adjustment code generator circuit 204, and the gain is set to a fixed value in the frequency update generator circuit 205 in the phase adjustment code generator circuit 204.

Figure 7:
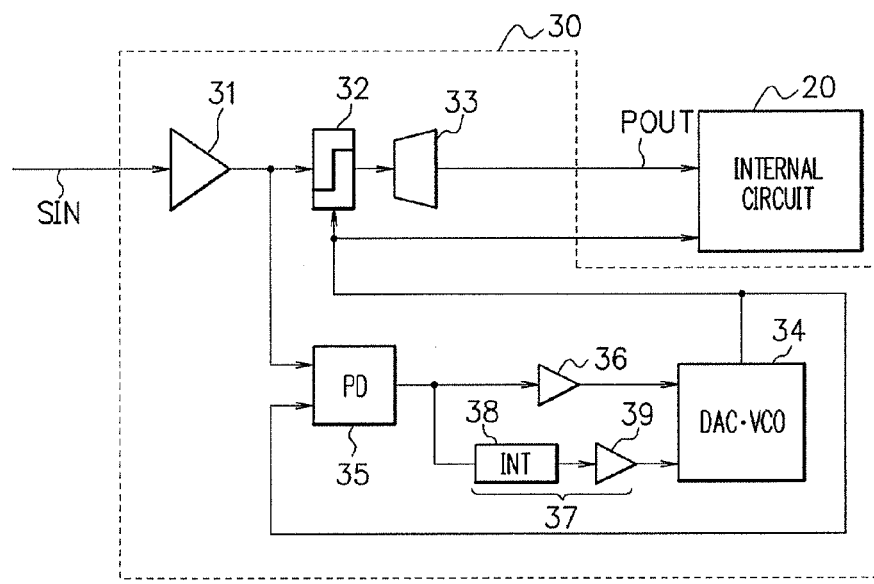
FIG. 7 is a diagram illustrating another configuration example of the semiconductor integrated circuit in the present embodiment.

The above-described embodiment describes the reception circuit to which the CDR circuit of phase interpolation type is applied, as an example, but, similar control can be performed also in a reception circuit 30 to which a CDR circuit of PLL system illustrated in FIG. 7 is applied. FIG. 7 is a block diagram illustrating another configuration example of the semiconductor integrated circuit in the present embodiment. The reception circuit 30 includes an equalizer 31, a latch circuit 32, a demultiplexer 33, a digital-to-analog converter (DAC) and voltage-controlled oscillator (VCO) 34, a phase comparator (PD) 35, a buffer 36, an integrator 38, and a buffer 39.

The equalizer 31, the latch circuit 32, and the demultiplexer 33 correspond to the equalizer 11, the latch circuit 12, and the demultiplexer 13, respectively, illustrated in FIG. 1. The phase comparator (PD) 35, the buffer 36, and an integration circuit 37 constituted of the integrator 38 and the buffer 39 correspond to the phase to digital converter 201 and the gain control code generator circuit 203, the frequency update generator circuit 205, and the phase update generator circuit 206, respectively, in the digital filter circuit. The digital-to-analog converter (DAC) and voltage-controlled oscillator (VCO) 34 controls an oscillation frequency in accordance an input digital code, and outputs an internal clock. Also in the semiconductor integrated circuit illustrated in FIG. 7, a mechanism of negative feedback control is formed by a gain in the buffer 36 and a gain in the integration circuit 37, which is similar to the above-described embodiment, so that it is only needed to dynamically vary the gain in accordance with a degree of bias of phase shift of the internal clock and the data.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

The disclosed digital filter circuit can give, at the time of generating the phase adjustment code, the appropriate gain by dynamically varying the gain to be given to the second determination code in accordance with the total sum of the first determination codes, resulting in that the reduction in the time until when the circuit is locked in the CDR circuit of the reception circuit and the stability of data when the circuit is locked can be realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. 1. A digital filter circuit comprising:
a first determinator circuit configured to sequentially determine whether a phase of a clock advances or delays with respect to an input serial signal, and to sequentially output first determination codes each indicating a result of the determination, the clock being used for logic determination of the input serial signal;
a second determinator circuit configured to output, for each of first periods, a second determination code indicating that the phase of the clock is made to be advanced or delayed based on a plurality of the first determination codes, the plurality of the first determination codes being output during the first period;

a first code generator circuit configured to calculate a total sum of the first determination codes during the first period, and to generate a gain control code based on the total sum; and a second code generator circuit configured to switch a gain to be given to the second determination code in accordance with the gain control code, and to generate and output, based on the second determination code, a phase adjustment code so that the phase of the clock is adjusted to make the phase of the clock follow the input serial signal.

2. The digital filter circuit according to claim 1, wherein the second determinator circuit is configured to output, for each of the first periods, the second determination code in accordance with the first determination code whose frequency of appearance is the highest during the first period.

3. The digital filter circuit according to claim 1, wherein the second code generator circuit includes:

a first gain circuit with which a frequency deviation of the clock with respect to the input serial signal is adjusted;

a second gain circuit with which a phase deviation of the clock with respect to the input serial signal is adjusted; and a phase adjustment code calculation circuit configured to generate the phase adjustment code by using an output of the first gain circuit and an output of the second gain circuit, wherein the gain to be given to the second determination code is switched in accordance with the gain control code, in at least either the first gain circuit or the second gain circuit.

4. The digital filter circuit according to claim 1, wherein the first code generator circuit includes:

a first counter circuit configured to count a number of times when the first determinator circuit determines that the phase of the clock advances with respect to the input serial signal based on the first determination codes;

a second counter circuit configured to count a number of times when the first determinator circuit determines that the phase of the clock delays with respect to the input serial signal based on the first determination codes; and a gain control code calculation circuit configured to generate the gain control code from a count value of the first counter circuit and a count value of the second counter circuit.

5. The digital filter circuit according to claim 1, wherein the second code generator circuit is configured to divide the gain to be given to the second determination code in three stages or more in accordance with the gain control code, and to switch the gain.

6. The digital filter circuit according to claim 1, wherein the first determinator circuit determines that the phase of the clock advances or delays with respect to the input serial signal based on a relationship of data and boundaries obtained from the input serial signal by using the clock.

7. A reception circuit, comprising:

a digital filter circuit configured to generate a phase adjustment code so that a phase of a clock used for logic determination of an input serial signal is adjusted to make the phase of the clock follow the input serial signal;

a phase interpolator circuit configured to output the clock whose phase is adjusted based on a supplied reference clock and the phase adjustment code; and a logic determination circuit configured to perform the logic determination of the input serial signal by using the phase-adjusted clock output from the phase interpolator circuit, wherein the digital filter circuit includes:

a first determinator circuit configured to sequentially determine whether the phase of the clock advances or delays with respect to the input serial signal, and to sequentially output first determination codes each indicating a result of the determination;

a second determinator circuit configured to output, for each of first periods, a second determination code indicating that the phase of the clock is made to be advanced or delayed based on a plurality of the first determination codes, the plurality of the first determination codes being output during the first period;

a first code generator circuit configured to calculate a total sum of the first determination codes during the first period, and to generate a gain control code based on the total sum; and a second code generator circuit configured to switch a gain to be given to the second determination code in accordance with the gain control code, and to generate and output the phase adjustment code based on the second determination code.

8. The reception circuit according to claim 7, wherein the second determinator circuit is configured to output, for each of the first periods, the second determination code in accordance with the first determination code whose frequency of appearance is the highest during the first period.

9. The reception circuit according to claim 7, further comprising a demultiplexer circuit configured to receive an output of the logic determination circuit, and to perform serial-to-parallel conversion to output parallel data.

10. The reception circuit according to claim 7, wherein the second code generator circuit includes:

a first gain circuit with which a frequency deviation of the clock with respect to the input serial signal is adjusted;

a second gain circuit with which a phase deviation of the clock with respect to the input serial signal is adjusted; and a phase adjustment code calculation circuit configured to generate the phase adjustment code by using an output of the first gain circuit and an output of the second gain circuit, wherein the gain to be given to the second determination code is switched in accordance with the gain control code, in at least either the first gain circuit or the second gain circuit.

11. The reception circuit according to claim 7, wherein the first code generator circuit includes:

a first counter circuit configured to count a number of times when the first determinator circuit determines that the phase of the clock advances with respect to the input serial signal based on the first determination codes;

a second counter circuit configured to count a number of times when the first determinator circuit determines that the phase of the clock delays with respect to the input serial signal based on the first determination codes; and a gain control code calculation circuit configured to generate the gain control code from a count value of the first counter circuit and a count value of the second counter circuit.

12. The reception circuit according to claim 7, wherein the second code generator circuit is configured to divide the gain to be given to the second determination code in three stages or more in accordance with the gain control code, and to switch the gain.

13. The reception circuit according to claim 7, wherein the first determinator circuit determines that the phase of the clock advances or delays with respect to the input serial signal based on a relationship of data and boundaries obtained from the input serial signal by using the clock.

14. A semiconductor integrated circuit, comprising:
a reception circuit configured to receive an input serial signal, and to reproduce a clock and data; and
an internal circuit configured to receive the data from the reception circuit, and to perform a processing operation, wherein
the reception circuit includes:
a digital filter circuit configured to generate a phase adjustment code so that a phase of the clock is adjusted to make the phase of the clock follow the input serial signal;
a phase interpolator circuit configured to output the clock whose phase is adjusted based on a supplied reference clock and the phase adjustment code; and
a logic determination circuit configured to perform logic determination of the input serial signal by using the phase-adjusted clock output from the phase interpolator circuit, wherein
the digital filter circuit includes:
a first determinator circuit configured to sequentially determine whether the phase of the clock advances or delays with respect to the input serial signal, and to sequentially output first determination codes each indicating a result of the determination;
a second determinator circuit configured to output, for each of first periods, a second determination code indicating that the phase of the clock is made to be advanced or delayed based on a plurality of the first determination codes, the plurality of the first determination codes are output during the first period;
a first code generator circuit configured to calculate a total sum of the first determination codes during the first period, and to generate a gain control code based on the total sum; and
a second code generator circuit configured to switch a gain to be given to the second determination code in accordance with the gain control code, and to generate and output the phase adjustment code based on the second determination code.

15. The semiconductor integrated circuit according to claim 14, wherein
the second determinator circuit is configured to output, for each of the first periods, the second determination code in accordance with the first determination code whose frequency of appearance is the highest during the first period.

16. The semiconductor integrated circuit according to claim 14, wherein
the reception circuit includes a demultiplexer circuit configured to receive an output of the logic determination circuit, and to perform serial-to-parallel conversion to output parallel data to the internal circuit.

17. The semiconductor integrated circuit according to claim 14, wherein
the second code generator circuit includes:
a first gain circuit with which a frequency deviation of the clock with respect to the input serial signal is adjusted;
a second gain circuit with which a phase deviation of the clock with respect to the input serial signal is adjusted; and
a phase adjustment code calculation circuit configured to generate the phase adjustment code by using an output of the first gain circuit and an output of the second gain circuit, wherein
the gain to be given to the second determination code is switched in accordance with the gain control code, in at least either the first gain circuit or the second gain circuit.

18. The semiconductor integrated circuit according to claim 14, wherein
the first code generator circuit includes:
a first counter circuit configured to count a number of times when the first determinator circuit determines that the phase of the clock advances with respect to the input serial signal based on the first determination codes;
a second counter circuit configured to count a number of times when the first determinator circuit determines that the phase of the clock delays with respect to the input serial signal based on the first determination codes; and
a gain control code calculation circuit configured to generate the gain control code from a count value of the first counter circuit and a count value of the second counter circuit.

19. The semiconductor integrated circuit according to claim 14, wherein
the second code generator circuit is configured to divide the gain to be given to the second determination code in three stages or more in accordance with the gain control code, and to switch the gain.

20. The semiconductor integrated circuit according to claim 14, wherein
the first determinator circuit determines that the phase of the clock advances or delays with respect to the input serial signal based on a relationship of data and boundaries obtained from the input serial signal by using the clock.

* * * * *